United States Patent
Herle et al.

(10) Patent No.: US 11,817,576 B2
(45) Date of Patent: Nov. 14, 2023

(54) INTEGRATED LITHIUM DEPOSITION WITH PROTECTIVE LAYER TOOL

(71) Applicant: Applied Materials, Inc., Santa Clara, CA (US)

(72) Inventors: Subramanya P. Herle, Mountain View, CA (US); Dieter Haas, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 284 days.

(21) Appl. No.: 17/183,976

(22) Filed: Feb. 24, 2021

(65) Prior Publication Data
US 2021/0184208 A1 Jun. 17, 2021

Related U.S. Application Data

(62) Division of application No. 16/067,075, filed as application No. PCT/US2017/013648 on Jan. 16, 2017, now Pat. No. 10,978,699.

(Continued)

(51) Int. Cl.
*H01M 4/36* (2006.01)
*H01M 4/38* (2006.01)
(Continued)

(52) U.S. Cl.
CPC .............. *H01M 4/366* (2013.01); *B32B 7/04* (2013.01); *B32B 7/06* (2013.01); *B32B 15/04* (2013.01);
(Continued)

(58) Field of Classification Search
CPC ........ H01M 4/366; H01M 4/13; H01M 4/139; H01M 4/0404; H01M 4/133; H01M 4/134;
(Continued)

(56) References Cited

U.S. PATENT DOCUMENTS

| 5,314,765 A | 5/1994 | Bates |
| 7,939,205 B2 * | 5/2011 | Klaassen ............... H01M 6/187 429/300 |

(Continued)

FOREIGN PATENT DOCUMENTS

| CN | 1297588 A | 5/2001 |
| CN | 1415122 | 4/2003 |

(Continued)

OTHER PUBLICATIONS

Office Action for Japanese Application No. 2022-007139 dated Jan. 31, 2023, 7 pages.

(Continued)

*Primary Examiner* — Gary D Harris
(74) *Attorney, Agent, or Firm* — PATTERSON + SHERIDAN, LLP

(57) ABSTRACT

In one implementation, an integrated processing tool for the deposition and processing of lithium metal in energy storage devices. The integrated processing tool may be a web tool. The integrated processing tool may comprises a reel-to-reel system for transporting a continuous sheet of material through the following chambers: a chamber for depositing a thin film of lithium metal on the continuous sheet of material and a chamber for depositing a protective film on the surface of the thin film of lithium metal. The chamber for depositing a thin film of lithium metal may include a PVD system, such as an electron-beam evaporator, a thin film transfer system, or a slot-die deposition system. The chamber for depositing a protective film on the lithium metal film may include a chamber for depositing an interleaf film or a chamber for depositing a lithium-ion conducting polymer on the lithium metal film.

20 Claims, 7 Drawing Sheets

Related U.S. Application Data

(60) Provisional application No. 62/288,217, filed on Jan. 28, 2016.

(51) Int. Cl.

| | | |
|---|---|---|
| *H01M 4/587* | (2010.01) | |
| *H01M 4/62* | (2006.01) | |
| *B32B 27/08* | (2006.01) | |
| *H01M 4/13* | (2010.01) | |
| *H01M 4/139* | (2010.01) | |
| *C23C 14/56* | (2006.01) | |
| *B32B 27/28* | (2006.01) | |
| *C23C 14/14* | (2006.01) | |
| *B32B 15/08* | (2006.01) | |
| *B32B 7/04* | (2019.01) | |
| *B32B 27/34* | (2006.01) | |
| *B32B 15/09* | (2006.01) | |
| *B32B 27/30* | (2006.01) | |
| *B32B 15/082* | (2006.01) | |
| *B32B 27/36* | (2006.01) | |
| *B32B 7/06* | (2019.01) | |
| *B32B 15/04* | (2006.01) | |
| *B32B 27/40* | (2006.01) | |
| *B32B 15/085* | (2006.01) | |
| *B32B 27/32* | (2006.01) | |
| *B32B 15/088* | (2006.01) | |
| *H01M 4/04* | (2006.01) | |
| *H01M 4/133* | (2010.01) | |
| *H01M 4/134* | (2010.01) | |
| *H01M 4/1393* | (2010.01) | |
| *H01M 4/1395* | (2010.01) | |
| *H01M 10/0525* | (2010.01) | |
| *H01M 4/02* | (2006.01) | |

(52) U.S. Cl.
CPC .......... *B32B 15/08* (2013.01); *B32B 15/082* (2013.01); *B32B 15/085* (2013.01); *B32B 15/088* (2013.01); *B32B 15/09* (2013.01); *B32B 27/08* (2013.01); *B32B 27/28* (2013.01); *B32B 27/281* (2013.01); *B32B 27/285* (2013.01); *B32B 27/302* (2013.01); *B32B 27/308* (2013.01); *B32B 27/32* (2013.01); *B32B 27/34* (2013.01); *B32B 27/36* (2013.01); *B32B 27/365* (2013.01); *B32B 27/40* (2013.01); *C23C 14/14* (2013.01); *C23C 14/562* (2013.01); *H01M 4/0404* (2013.01); *H01M 4/13* (2013.01); *H01M 4/133* (2013.01); *H01M 4/134* (2013.01); *H01M 4/139* (2013.01); *H01M 4/1393* (2013.01); *H01M 4/1395* (2013.01); *H01M 4/364* (2013.01); *H01M 4/382* (2013.01); *H01M 4/386* (2013.01); *H01M 4/587* (2013.01); *H01M 4/628* (2013.01); *H01M 10/0525* (2013.01); *B32B 2270/00* (2013.01); *B32B 2307/546* (2013.01); *B32B 2307/732* (2013.01); *B32B 2307/748* (2013.01); *B32B 2457/00* (2013.01); *H01M 2004/027* (2013.01)

(58) Field of Classification Search
CPC .. H01M 4/1393; H01M 4/1395; H01M 4/364; H01M 4/382; H01M 10/0525; H01M 4/386; H01M 4/587; H01M 4/628; H01M 2004/027; H01M 4/0423; B32B 27/08; B32B 27/281; B32B 15/08; B32B 7/04; B32B 27/34; B32B 15/09; B32B 27/308; B32B 15/082; B32B 27/28; B32B 27/285; B32B 27/365; B32B 7/06; B32B 15/04; B32B 27/302; B32B 27/36; B32B 27/40; B32B 15/085; B32B 27/32; B32B 15/088; B32B 2307/748; B32B 2457/00; B32B 2270/00; B32B 2307/732; B32B 2307/546; C23C 14/562; C23C 14/14; Y02E 60/122
USPC ...................................... 429/231.8
See application file for complete search history.

(56) References Cited

U.S. PATENT DOCUMENTS

| | | |
|---|---|---|
| 2004/0106037 A1 | 6/2004 | Cho et al. |
| 2007/0243454 A1 | 10/2007 | Klaassen |
| 2013/0011728 A1 | 1/2013 | Tokuda et al. |
| 2013/0122365 A1 | 5/2013 | Zaghib et al. |
| 2016/0013462 A1 | 1/2016 | Cui et al. |
| 2016/0118652 A1* | 4/2016 | Wu ............... H01M 4/364 |
| | | 429/213 |

FOREIGN PATENT DOCUMENTS

| | | |
|---|---|---|
| CN | 1415122 A | 4/2003 |
| CN | 102201565 A | 9/2011 |
| CN | 102449841 A | 5/2012 |
| CN | 102544585 A | 7/2012 |
| CN | 103094513 A | 5/2013 |
| CN | 103682368 A | 3/2014 |
| CN | 103915604 A | 7/2014 |
| CN | 105074968 A | 11/2015 |
| JP | 2003123740 | 4/2003 |
| JP | 2003123740 A | 4/2003 |
| JP | 2007109423 | 4/2007 |
| JP | 2007109423 A | 4/2007 |
| JP | 2007-214109 | 8/2007 |
| JP | 2007-214109 A | 8/2007 |
| JP | 2010250968 | 11/2010 |
| JP | 2010250968 A | 11/2010 |
| JP | 5172134 | 3/2013 |
| JP | 5172134 B2 | 3/2013 |
| KR | 20140083181 A | 7/2014 |
| TW | 201330352 A | 7/2013 |
| TW | 2013/37989 | 9/2013 |
| TW | 2013/37989 A | 9/2013 |
| WO | 0139302 | 5/2001 |
| WO | 0139302 A1 | 5/2001 |
| WO | 0215301 A2 | 2/2002 |
| WO | 2013121164 | 8/2013 |
| WO | 2013121164 A1 | 8/2013 |

OTHER PUBLICATIONS

Chinese Office Action dated Dec. 7, 2021 for Application No. 201780008939.4.
Office Action for Taiwan Application No. 106102017 dated Aug. 16, 2021.
Search Report for Taiwan Application No. 106102017 dated Aug. 13, 2021.
International Search Report and Written Opinion dated May 1, 2017 for Application No. PCT/US2017/013648.
Office Action for Taiwan Application No. 106102017 dated Sep. 8, 2020.
Search Report for Taiwan Application No. 106102017 dated Sep. 4, 2020.
Office Action for Japanese Application No. 2018-539037 dated Dec. 22, 2020.
Office Action for Chinese Application No. 201780008939.4 dated Nov. 30, 2020.
Search Report for Chinese Application No. 201780008939.4 dated Nov. 20, 2020.
Office Action for Taiwan Application No. 106102017 dated Jan. 13, 2021.

(56) References Cited

OTHER PUBLICATIONS

Search Report for Taiwan Application No. 106102017 dated Jan. 8, 2021.
Office Action for U.S. Appl. No. 16/067,075 dated Mar. 23, 2020.
Final Office Action for U.S. Appl. No. 16/067,075 dated Aug. 28, 2020.
Office Action for Chinese Application No. 201780008939.4 dated Jul. 1, 2021.
Search Report for Chinese Application No. 201780008939.4 dated Jun. 23, 2021.
Office Action for Japanese Application No. 2018-539037 dated Sep. 7, 2021.
Taiwan Office Action dated Nov. 7, 2022 for Application No. 111108116.
Chinese Patent Application No. 202210706128.4, Office Action dated Jul. 11, 2023, 14 pages.

* cited by examiner

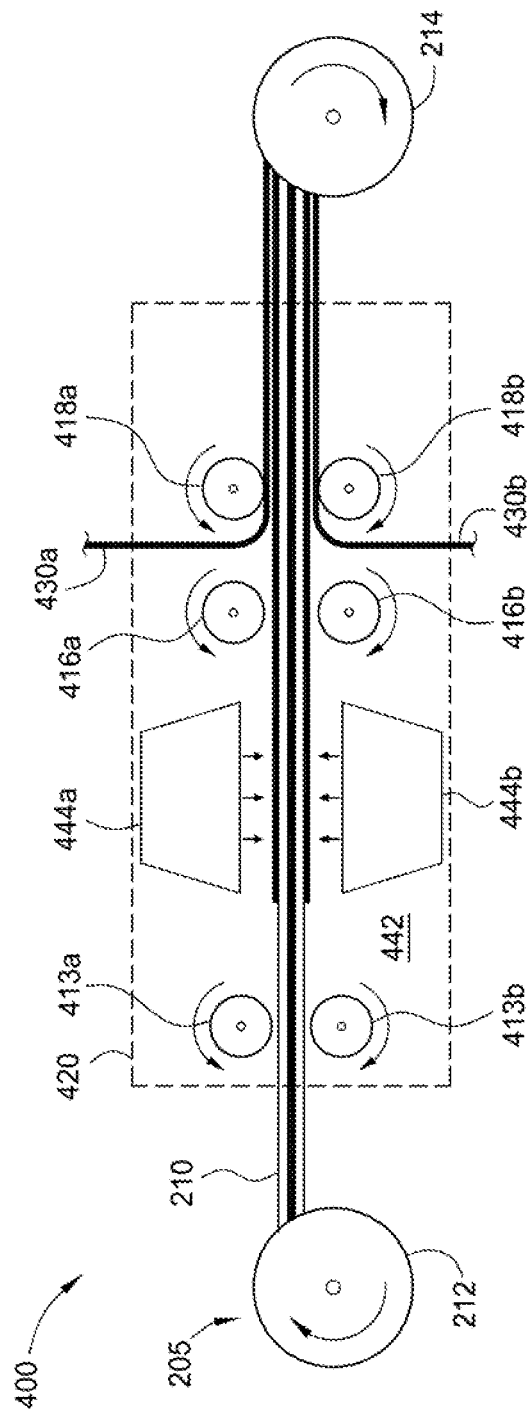
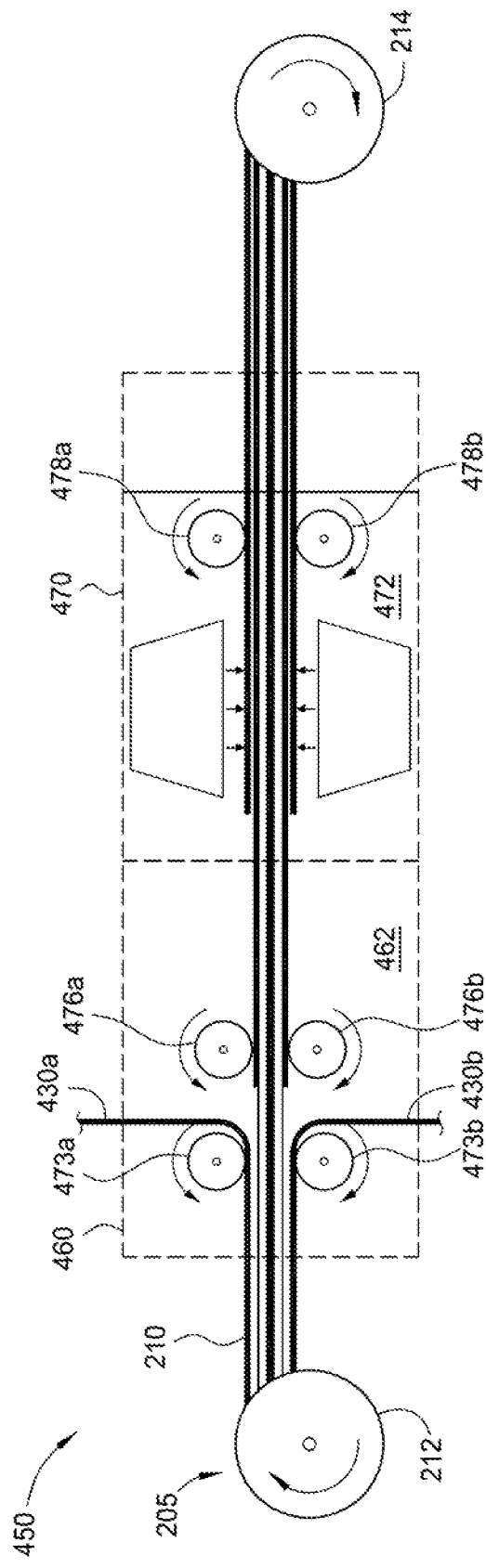

INTEGRATED LITHIUM DEPOSITION WITH PROTECTIVE LAYER TOOL

CROSS-REFERENCE TO RELATED APPLICATIONS

This application is a divisional of U.S. patent application Ser. No. 16/067,075, filed Jun. 28, 2018, which claims the benefit of International Application No. PCT/US2017/013648, filed Jan. 16, 2017, which claims benefit of U.S. provisional patent application Ser. No. 62/288,217, filed Jan. 28, 2016, all of which are incorporated herein by reference in their entireties.

BACKGROUND

Field

Implementations described herein generally relate to lithium metal deposition and processing. More particularly, the implementations described herein relate to methods and systems for the deposition and processing of lithium metal in energy storage devices.

Description of the Related Art

Rechargeable electrochemical storage systems are currently becoming increasing important for many fields of everyday life. High-capacity electrochemical energy storage devices, such as lithium-ion (Li-ion) batteries, are used in a growing number of applications, including portable electronics, medical, transportation, grid-connected large energy storage, renewable energy storage, and uninterruptible power supply (UPS). Traditional lead/sulfuric acid batteries often lack the capacitance and are often inadequately cycleable for these growing applications. Lithium-ion batteries, however, are thought to have the best chance.

Typically, lithium batteries do not contain any metallic lithium for safety reasons but instead use a graphitic material as the anode. However, the use of graphite, which, in the charged state can be charged up to the limit composition $LiC_6$, results in a much lower capacitance, in comparison with the use of metallic lithium. Currently, the industry is moving away from graphitic-based anodes to silicon-blended graphite to increase energy cell density. However, silicon blended graphite anodes suffer from first cycle capacity loss. Thus, there is a need for lithium metal deposition to replenish first cycle capacity loss of silicon blended graphite anodes. However, lithium metal faces several device integration challenges.

Lithium is an alkali metal. Like the heavy element homologs of the first main group, lithium is characterized by a strong reactivity with a variety of substances. Lithium reacts violently with water, alcohols and other substances that contain protic hydrogen, often resulting in ignition. Lithium is unstable in air and reacts with oxygen, nitrogen and carbon dioxide. Lithium is normally handled under an inert gas atmosphere (noble gases such as argon) and the strong reactivity of lithium requires that other processing operations also be performed in an inert gas atmosphere. As a result, lithium provides several challenges when it comes to processing, storage, and transportation.

Protective surface treatments have been developed for lithium metal. One method of protective surface treatment of lithium metal consists of coating the lithium metal with a wax layer, for example, polyethylene wax. However, a large amount of coating agent must be applied which interferes with subsequent processing of the lithium metal layer.

Another method of protective surface treatment proposes producing stabilized lithium metal powder ("SLMP") with a continuous carbonate coating, polymer coating, for example, polyurethanes, PTFE, PVC, polystyrene and others. However, these polymer coatings can cause problems when prelithiating electrode materials.

Therefore, there is a need for methods and systems for the deposition and processing of lithium metals in energy storage systems.

SUMMARY

Implementations described herein generally relate to lithium metal deposition and processing. More particularly, the implementations described herein relate to methods and systems for the deposition and processing of lithium metal in energy storage devices. In one implementation, a negative electrode is provided. The negative electrode is coated with a thin film of lithium metal. The thin film of lithium metal may be of sufficient thickness to compensate for the irreversible loss of lithium metal during the first cycle of the battery, which in some implementations, may be a lithium metal film from about 1 to about 20 microns thick. The lithium metal film may be used as a lithium metal anode. Further, the lithium metal film may be coated with a protective film for protecting the lithium metal film from ambient oxidants. In one implementation, the protective film comprises an ion-conducting polymer material, which is incorporated into the final battery cell. In another implementation, the protective film comprises an interleaf film, which protects the lithium metal film from ambient oxidants. The interleaf film is typically removed prior to additional processing. In some implementations, the interleaf film may function as a separator.

In another implementation, a lithium battery is provided. The lithium battery comprises a positive electrode, a negative electrode coated with the thin film of lithium metal. The thin film of lithium metal may be of sufficient thickness to compensate for the irreversible loss of lithium metal during the first cycle of the battery, which in some implementations, may be a lithium metal film from about 1 to about 20 microns thick. Further, the lithium metal film may be coated with an ion-conducting polymer for protecting the lithium metal film from ambient oxidants.

In yet another implementation, an integrated processing tool for forming lithium coated negative electrodes is provided. The integrated processing tool may be a web tool, a roll-to-roll covering vacuum and non-vacuum deposition techniques such as PVD, Slot-Die, Gravure, thermal spraying, lamination, and screen-printing. The integrated processing tool may comprises a reel-to-reel system for transporting a continuous sheet of material through the following chambers: a chamber for depositing a thin film of lithium metal on the continuous sheet of material and a chamber for depositing a protective film on the surface of the thin film of lithium metal. In some implementations, the chamber for depositing a thin film of lithium metal may include a PVD system, such as an electron-beam evaporator, a thin film transfer system (including large area pattern printing systems such as gravure printing systems), a lithium film transfer system (e.g., laminating lithium onto a negative electrode with an optional release layer between the lithium and the negative electrode), or a slot-die deposition system. In some implementations, the chamber for depositing a protective film on the lithium metal film may include a chamber for depositing an interleaf film or a chamber for depositing a lithium-ion conducting polymer on the lithium metal film. The integrated processing tool may further comprise a chamber for removing the interleaf film prior to additional processing. In some implementations, the integrated processing tool further comprises a chamber for forming a negative electrode material on the continuous sheet of material. In some implementations, the continuous sheet of material is a flexible conductive substrate.

In yet another implementation, a method of forming a negative electrode is provided. The method comprises, forming a lithium metal film on a negative electrode, forming an interface film on the lithium metal film, and forming a protective film on the interface film, wherein the interface film is either a release film, a metal fluoride film, or a metal oxide film.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 4A illustrates a schematic view of another integrated processing tool according to implementations described herein;

FIG. 4B illustrates a schematic view of another integrated processing tool according to implementations described herein;

Figure 1A:
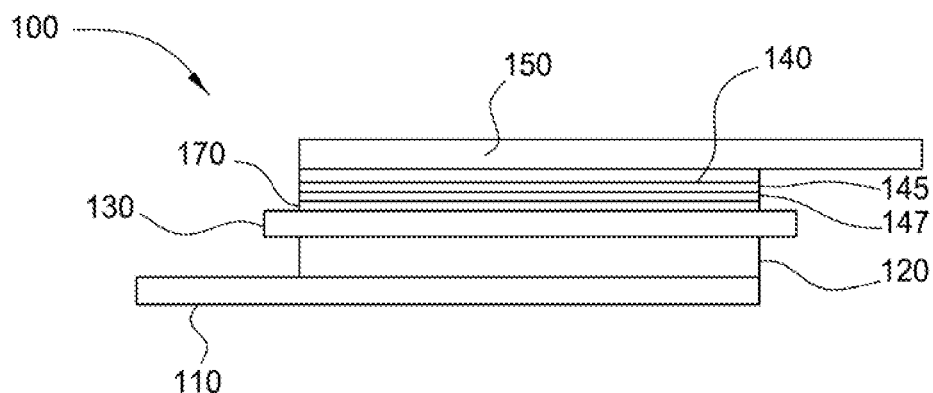
FIG. 1A illustrates a cross-sectional view of one implementation of an electrode structure formed according to implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes negative electrodes, high performance electrochemical cells and batteries including the aforementioned negative electrodes, and methods for fabricating the same. Certain details are set forth in the following description and in FIGS. 1-7 to provide a thorough understanding of various implementations of the disclosure. Other details describing well-known structures and systems often associated with electrochemical cells and batteries are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a reel-to-reel coating system, such as TopMet™, SmartWeb™, TopBeam™, all of which are available from Applied Materials, Inc. of Santa Clara, Calif. Other tools capable of performing high rate evaporation processes may also be adapted to benefit from the implementations described herein. In addition, any system enabling high rate evaporation processes described herein can be used to advantage. The apparatus description described herein is illustrative and should not be construed or interpreted as limiting the scope of the implementations described herein. It should also be understood that although described as a reel-to-reel process, the implementations described herein may also be performed on discrete substrates.

Energy storage devices, for example, batteries, typically consist of a positive electrode, a negative electrode separated by a porous separator and electrolyte, which is used as an ion-conductive matrix. Graphite anodes are the current state of the art but the industry is moving from the graphite based anode to silicon blended graphite anodes to increase cell energy density. However, silicon blended graphite anodes often suffer from irreversible capacity loss that occurs during the first cycle. Thus, there is a need for methods for replenishing this first cycle capacity loss.

Deposition of lithium metal is one such method for replenishing this first cycle capacity loss of silicon blended graphite anode. While there are numerous methods for lithium metal deposition (e.g., thermal evaporation, lamination, printing, etc.), handling of lithium metal deposited on a spool before device stacking needs to be addressed, especially in a high-volume manufacturing environment. In one implementation, methods and systems for forming an interleaf on the lithium metal film are provided. In another implementation, methods and systems for lithium polymer deposition are provided. In yet another implementation, an integrated tool for both lithium metal deposition and ion-conducting polymer deposition are provided.

Using the implementations described herein, the deposited lithium metal, either single-sided or dual-sided, can be protected during winding and unwinding of the reels downstream. Deposition of thin films of Li-ion conducting polymers, ion conducting ceramics, or ion conducting glass helps in several ways. First, reels of electrodes containing lithium metal can be wound/unwound without lithium metal touching adjacent electrodes. Second, a stable solid electrolyte interface (SEI) is established for better cell performance and high electrochemical utilization of lithium metal. In addition, the use of protective films reduces the complexity of manufacturing systems and is compatible with current manufacturing systems.

FIG. 1A illustrates an example lithium-ion energy storage device 100 having a lithium metal film formed according to implementations of the present disclosure. The lithium-ion energy storage device 100 has a positive current collector 110, a positive electrode 120, a separator 130, a negative electrode 140, a lithium metal film 145, an optional interface film 147, with an optional protective film 170 formed thereon, and a negative current collector 150. Note in FIG. 1 that the current collectors are shown to extend beyond the stack, although it is not necessary for the current collectors to extend beyond the stack, the portions extending beyond the stack may be used as tabs.

The current collectors 110, 150, on positive electrode 120 and negative electrode 140, respectively, can be identical or different electronic conductors. Examples of metals that the current collectors 110, 150 may be comprised of include aluminum (Al), copper (Cu), zinc (Zn), nickel (Ni), cobalt (Co), tin (Sn), silicon (Si), manganese (Mn), magnesium (Mg), alloys thereof, and combinations thereof. In one implementation, at least one of the current collectors 110, 150 is perforated. Furthermore, current collectors may be of any form factor (e.g., metallic foil, sheet, or plate), shape and micro/macro structure. Generally, in prismatic cells, tabs are formed of the same material as the current collector and may be formed during fabrication of the stack, or added later. All components except current collectors 110 and 150 contain lithium-ion electrolytes.

The negative electrode 140 or anode may be any material compatible with the positive electrode 120. The negative electrode 140 may have an energy capacity greater than or equal to 372 mAh/g, preferably ≥700 mAh/g, and most preferably ≥1000 mAh/g. The negative electrode 140 may be constructed from a graphite, silicon-containing graphite, lithium metal, lithium metal foil or a lithium alloy foil (e.g. lithium aluminum alloys), or a mixture of a lithium metal and/or lithium alloy and materials such as carbon (e.g. coke, graphite), nickel, copper, tin, indium, silicon, oxides thereof, or combinations thereof. The negative electrode 140 typically comprises intercalation compounds containing lithium or insertion compounds containing lithium. In some implementations, wherein the negative electrode 140 comprises lithium metal, the lithium metal may be deposited using the methods described herein.

In some implementations, a lithium metal film 145 is formed on the negative electrode 140. The lithium metal film 145 may be formed according to the implementations described herein. In some implementations, the negative electrode 140 is a silicon graphite anode with the lithium metal film 145 formed thereon. The lithium metal film 145 replenishes lithium lost from first cycle capacity loss of the negative electrode 140. The lithium metal film may be a thin lithium metal film (e.g., 20 microns or less, from about 1 micron to about 20 microns, from about 2 microns to about 10 microns). In some implementations where the lithium metal film 145 functions as the negative electrode, the lithium metal film 145 replaces the negative electrode 140. In some implementations where the lithium metal film 145 functions as the negative electrode the lithium metal film 145 is formed on the current collector 150.

In some implementations, a protective film 170 is formed on the lithium metal film 145. The protective film 170 may be an ion-conducting polymer. The protective film 170 may be porous. In some implementations, the protective film 170 has nano-pores. In one implementation, the protective film 170 has a plurality of nano-pores that are sized to have an average pore size or diameter less than about 10 nanometers (e.g., from about 1 nanometer to about 10 nanometers; from about 3 nanometers to about 5 nanometers). In another implementation, the protective film 170 has a plurality of nano-pores that are sized to have an average pore size or diameter less than about 5 nanometers. In one implementation, the protective film 170 has a plurality of nano-pores having a diameter ranging from about 1 nanometer to about 20 nanometers (e.g., from about 2 nanometers to about 15 nanometers; or from about 5 nanometers to about 10 nanometers).

The protective film 170 may be a coating or a discrete layer, either having a thickness in the range of 1 nanometer to 2,000 nanometers (e.g., in the range of 10 nanometers to 600 nanometers; in the range of 50 nanometers to 200 nanometers; in the range of 100 nanometers to 150 nanometers). The protective film 170 may be a discrete membrane having a thickness in the range of 5 microns to 50 microns (e.g., in the range of 6 microns to 25 microns). In some implementations, where the protective film 170 is an interleaf film, the protective film 170 functions as a separator and takes the place of separator 130.

Examples of polymers that may be used to form the protective film 170 include, but are not limited to, polyvinylidene difluoride (PVDF), polyethylene oxide (PEO), poly-acrylonitrile (PAN), carboxymethyl cellulose (CMC), styrene butadiene rubber (SBR), ionic liquids and combinations thereof. Not to be bound by theory but it is believed that the protective film 170 can take-up Li-conducting electrolyte to form gel during device fabrication which is beneficial for forming good solid electrolyte interface (SEI) and also helps lower resistance. The protective film 170 can be formed by dip-coating, slot-die coating, gravure coating, or printing. The protective film 170 can also be deposited using Metacoat equipment.

The protective film 170 may be a lithium-ion conducting material. The lithium-ion conducting material may be a lithium-ion conducting ceramic or a lithium-ion conducting glass. The Li-ion conducting material may be comprised of one or more of LiPON, doped variants of either crystalline or amorphous phases of $Li_7La_3Zr_2O_{12}$, doped anti-perovskite compositions, $Li_2S$—$P_2S_5$, $Li_{10}GeP_2S_{12}$, and $Li_3PS_4$, lithium phosphate glasses, $(1-x)LiI-(x)Li_4SnS_4$, $xLiI-(1-x)Li_4SnS_4$, mixed sulfide and oxide electrolytes (crystalline LLZO, amorphous $(1-x)LiI-(x)Li_4SnS_4$ mixture, and amorphous $xLiI-(1-x)Li_4SnS_4$) for example. In one implementation, x is between 0 and 1 (e.g., 0.1, 0.2, 0.3, 0.4, 0.5, 0.6, 0.7, 0.8, and 0.9). The Li-ion conducting material can be directly deposited on the lithium metal film using either a by Physical Vapor Deposition (PVD), Chemical Vapor Deposition (CVD), spray, doctor blade, printing or any of a number of coating methods. A suitable method for some implementations is PVD. In some implementations, the protective film 170 does not need to be ion conducting, however, once filled with electrolyte (liquid, gel, solid, combination etc.), the combination of porous substrate and electrolyte is ion conducting.

In one implementation, the protective film is the lithium-ion conducting material and the lithium-ion conducting material is selected from the group consisting of: LiPON, crystalline or amorphous phases of garnet-type $Li_7La_3Zr_2O_{12}$, LISICON (e.g., $Li_{2+2x}Zn_{1-x}GeO_4$ wherein $0<x<1$), NASICON (e.g., $Na_{1+x}Zr_2Si_xP_{3-x}O_{12}$ wherein $0<x<3$), lithium borohydride ($LiBH_4$), doped anti-perovskite compositions, lithium containing sulfides (e.g., $Li_2S$, $Li_2S$—$P_2S_5$, $Li_{10}GeP_2S_{12}$ and $Li_3PS_4$), and lithium argyrodites (e.g., $LiPS_5X$ wherein x is Cl, Br or I).

The protective film 170 may be an interleaf film. The interleaf film may comprise a thermoplastic, such as a polyethylene, a polypropylene, a poly(ethylene terephthalate), a poly(butylene terephthalate) a polyester, a polyamide, a polyaramid, a polyacrylate, a polycarbonate, a poly(ester carbonate), a polybenzimidazole, a polyimide, a polyether imide, a polyamide imide, and the like. In some implementations, the interleaf film is selected from the group consisting of: polyethylene, polypropylene, poly(ethylene terephthalate), poly(butylene terephthalate), polyester, polyamide, polyaramid, polyacrylate, polycarbonate, poly (ester carbonate), polybenzimidazole, a polyimide, a polyether imide, a polyamide imide, and combinations thereof.

In some implementations, an interface film 147 is formed between the protective film 170 and the lithium metal film 145. In some implementations, the interface film 147 has a thickness from about 0.1 microns to about 5.0 microns (e.g., in the range of about 1 microns to about 4 microns; or in the range of about 2 microns to about 3 microns). The interface film 147 typically has a thickness that is thin enough to be ion conducting.

In some implementations, where the protective film 170 is an interleaf film, the interface film 147 includes a release agent. The release agent helps improve the removal of the protective film 170 from the lithium metal film 145. The release agent may be a silicon-containing compound, polyolefin, polyfluorocarbon, polyamide, polyester, polycarbonate, polyurethane, polystyrene, polycaprolactone, and mixtures and copolymers thereof. The interface film 147 including the release agent may be formed by roll coating, spray coating, gravure coating, slot-die coating or other similar means. In some implementations, the interface film 147 is selected from the group consisting of polyolefin, polyfluorocarbon, polyamide, polyester, polycarbonate, polyurethane, polystyrene, polycaprolactone, and mixtures and copolymers thereof. In some implementations, the interface film 147 containing the release agent is formed on the protective film 170 prior to formation of the lithium-ion energy storage device 100.

In some implementations, where the protective film 170 is a lithium-ion conducting film, the interface film 147 improves the stability of the lithium metal film 145 relative to the protective film 170. In some implementations, the interface film 147 is a metal oxide film. The metal oxide film may be $Al_2O_3$, $LiAlO_2$, $LiAl_5O_8$, $ZrO_2$, $Li_2ZrO_3$, $Li_2O$, $Li_2S$, and mixtures thereof. In some implementations, the interface film 147 is a lithium containing metal fluoride film (e.g., LiF). In some implementations, the interface film is selected from the group consisting of the group consisting of LiF, $Al_2O_3$, $LiAlO_2$, $LiAl_5O_8$, $ZrO_2$, $Li_2ZrO_3$, $Li_2O$, and mixtures thereof. The interface film 147, including the metal oxide film or lithium fluoride film, may be formed by evaporation, roll coating, spray coating, gravure coating, slot-die coating or other similar means. In some implementations, the interface film 147 containing the metal oxide film is formed on the protective film 170 prior to formation of the lithium-ion energy storage device 100.

The positive electrode 120 or cathode may be any material compatible with the anode and may include an intercalation compound, an insertion compound, or an electrochemically active polymer. Suitable intercalation materials include, for example, lithium-containing metal oxides, $MoS_2$, $FeS_2$, $MnO_2$, $TiS_2$, $NbSe_3$, $LiCoO_2$, $LiNiO_2$, $LiMnO_2$, $LiMn_2O_4$, $V_6O_{13}$ and $V_2O_5$. Suitable polymers include, for example, polyacetylene, polypyrrole, polyaniline, and polythiopene. The positive electrode 120 or cathode may be made from a layered oxide, such as lithium cobalt oxide, an olivine, such as lithium iron phosphate, or a spinel, such as lithium manganese oxide. Exemplary lithium-containing oxides may be layered, such as lithium cobalt oxide ($LiCoO_2$), or mixed metal oxides, such as $LiNi_xCo_{1-2x}MnO_2$, $LiNiMnCoO_2$ ("NMC"), $LiNi_{0.5}Mn_{1.5}O_4$, $Li(Ni_{0.8}Co_{0.15}Al_{0.05})O_2$, $LiMn_2O_4$, and doped lithium rich layered-layered materials, wherein x is zero or a non-zero number. Exemplary phosphates may be iron olivine ($LiFePO_4$) and it is variants (such as $LiFe_{(1-x)}Mg_xPO_4$), $LiMoPO_4$, $LiCoPO_4$, $LiNiPO_4$, $Li_3V_2(PO_4)_3$, $LiVOPO_4$, $LiMP_2O_7$, or $LiFe_{1.5}P_2O_7$, wherein x is zero or a non-zero number. Exemplary fluorophosphates may be $LiVPO_4F$, $LiALPO_4F$, $Li_5V(PO_4)_2F_2$, $Li_5Cr(PO_4)_2F_2$, $Li_2CoPO_4F$, or $Li_2NiPO_4F$. Exemplary silicates may be $Li_2FeSiO_4$, $Li_2MnSiO_4$, or $Li_2VOSiO_4$. An exemplary non-lithium compound is $Na_5V_2(PO_4)_2F_3$.

In some implementations of a lithium-ion cell according to the present disclosure, lithium is contained in atomic layers of crystal structures of carbon graphite ($LiC_6$) at the negative electrode and lithium manganese oxide ($LiMnO_4$) or lithium cobalt oxide ($LiCoO_2$) at the positive electrode, for example, although in some implementations the negative electrode may also include lithium absorbing materials such as silicon, tin, etc. The cell, even though shown as a planar structure, may also be formed into a cylinder by reeling the stack of layers; furthermore, other cell configurations (e.g., prismatic cells, button cells) may be formed.

Electrolytes infused in cell components 120, 130, 140, 147, 145 and 170 can be comprised of a liquid/gel or a solid polymer and may be different in each. In some implementations, the electrolyte primarily includes a salt and a medium (e.g., in a liquid electrolyte, the medium may be referred to as a solvent; in a gel electrolyte, the medium may be a polymer matrix). The salt may be a lithium salt. The lithium salt may include, for example, $LiPF_6$, $LiAsF_6$, $LiCF_3SO_3$, $LiN(CF_3SO_3)_3$, $LiBF_6$, and $LiClO_4$, BETTE electrolyte (commercially available from 3M Corp. of Minneapolis, Minn.) and combinations thereof. Solvents may include, for example, ethylene carbonate (EC), propylene carbonate (PC), EC/PC, 2-MeTHF(2-methyltetrahydrofuran)/EC/PC, EC/DMC (dimethyl carbonate), EC/DME (dimethyl ethane), EC/DEC (diethyl carbonate), EC/EMC (ethyl methyl carbonate), EC/EMC/DMC/DEC, EC/EMC/DMC/DEC/PE, PC/DME, and DME/PC. Polymer matrices may include, for example, PVDF (polyvinylidene fluoride), PVDF:THF (PVDF:tetrahydrofuran), PVDF:CTFE (PVDF: chlorotrifluoroethylene) PAN (polyacrylonitrile), and PEO (polyethylene oxide).

Figure 1B:
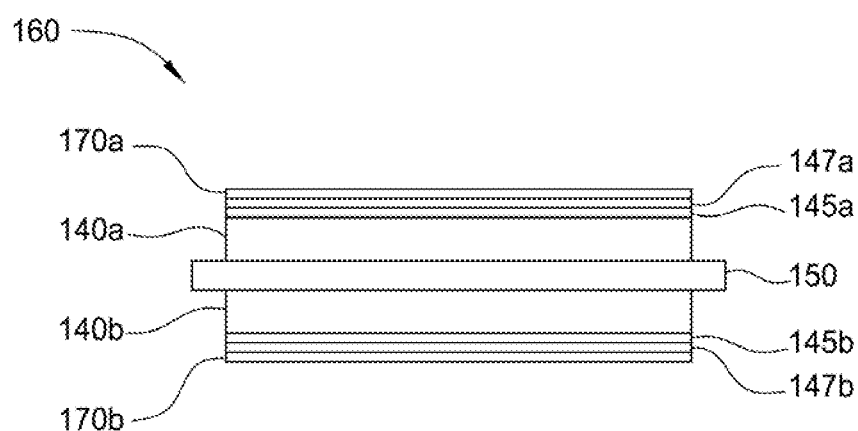
FIG. 1B illustrates a cross-sectional view of a dual-sided negative electrode structure formed according to implementations described herein.

FIG. 1B illustrates an example of a negative electrode cell 160 that may be combined with a positive electrode cell to form a lithium-ion energy storage device. The negative electrode cell 160 has a lithium metal film 145a, 145b with a protective film 170a, 170b formed thereon according to implementations of the present disclosure. In some implementations, an interface film 147a, 147b is formed between the lithium metal film 145a, 145b and the protective film 170a, 170b. The lithium metal film 145a, 145b may be a thin lithium metal film (e.g., 20 microns or less, from about 1 micron to about 20 microns, from about 2 microns to about 10 microns). The protective film 170a, 170b may be an interleaf film or ion-conducting polymer film as described herein. The interface film 147a, 147b may contain a release agent or metal oxides as previously described herein. In some implementations where protective film 170a, 170b is an interleaf film, the interleaf film is typically removed prior to combining the negative electrode cell 160 with a positive electrode cell to form a lithium-ion storage device. In some implementations where protective film 170a, 170b is an ion-conducting polymer film, the ion-conducting polymer film is incorporated into the final battery structure.

The negative electrode cell 160 has a negative current collector 150, a negative electrode 140a, 140b formed on the negative current collector 150, lithium metal film 145a, 145b formed on the negative electrode 140a, 140b, and protective film 170a, 170b formed on the lithium metal film 145a, 145b. Although the negative electrode cell 160 is depicted as a dual-sided cell, it should be understood that the implementations described herein also apply to single-sided cells.

A negative electrode cell may be fabricated using tools of the present disclosure as described herein. According to some implementations, a web tool for forming lithium coated negative electrodes may comprise: a reel-to-reel system for transporting a substrate or current collector through the following chambers: a chamber for depositing negative electrode on the current collector, a chamber for depositing a thin film of lithium on the negative electrode, and a chamber for depositing a protective film on the thin film of lithium. The chamber for depositing the thin film of lithium may include an evaporation system, such as an electron-beam evaporator, a thermal evaporator, or a thin film transfer system (including large area pattern printing systems such as gravure printing systems).

In some implementations, the tool may further comprise a chamber for surface modification, such as a plasma pre-treatment chamber, of the continuous sheet of material prior to deposition of the thin film of lithium and the protective film. Further, in some implementations the tool may further comprise a chamber for depositing a binder soluble in a liquid electrolyte or a lithium-ion conducting dielectric material.

According to some implementations, the negative electrode cell 160 of FIG. 1B may be fabricated utilizing the following processes and equipment. Several configurations of a web tool for fabricating the negative electrode cell 160 according to the present disclosure is shown schematically in FIG. 2, FIG. 4A, FIG. 4B, FIG. 6 and FIG. 7. It should be noted that these figures are schematic representations and it is understood that the configurations of the web system and chambers may be varied as needed to control the different processes of fabrication.

Figure 2:
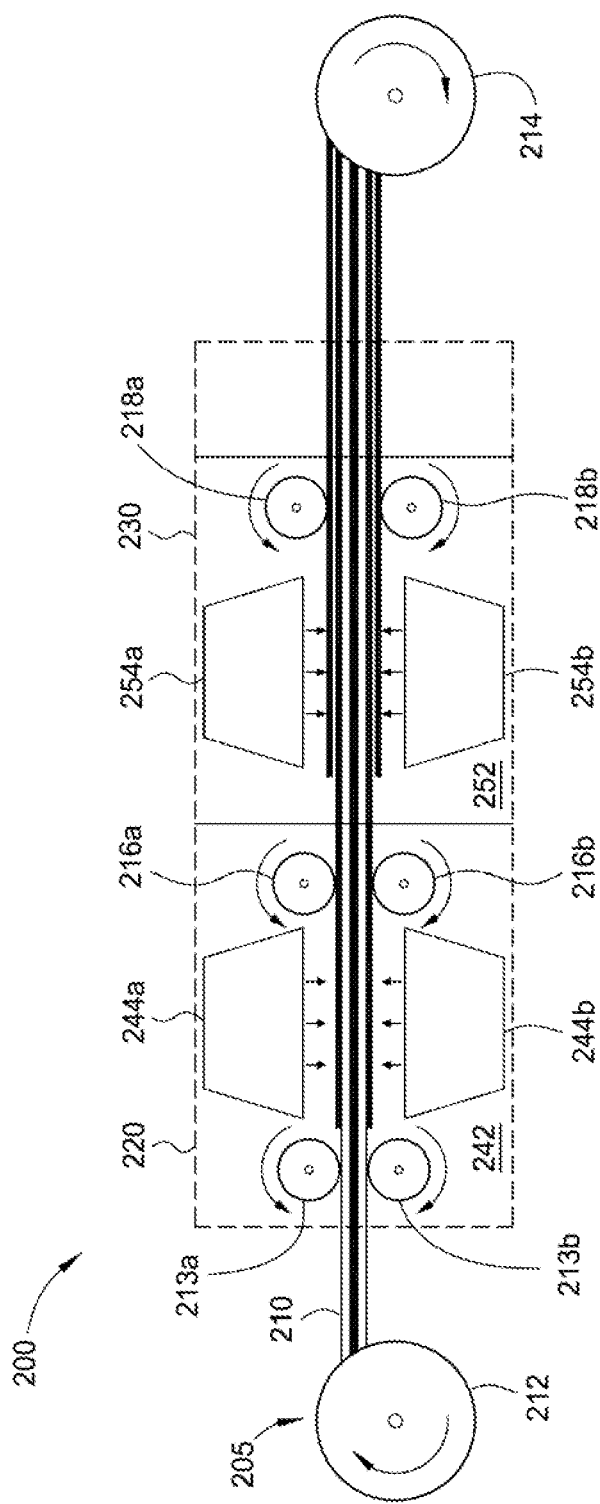
FIG. 2 illustrates a schematic view of an integrated processing tool according to implementations described herein.

FIG. 2 illustrates a schematic view of an integrated processing tool 200 according to implementations described herein. In certain implementations, the integrated processing tool 200 comprises a plurality of processing modules or chambers 220 and 230 arranged in a line, each configured to perform one processing operation to a continuous sheet of material 210. In one implementation, the processing chambers 220 and 230 are stand-alone modular processing chambers wherein each modular processing chamber is structurally separated from the other modular processing chambers. Therefore, each of the stand-alone modular processing chambers, can be arranged, rearranged, replaced, or maintained independently without affecting each other. In certain implementations, the processing chambers 220 and 230 are configured to process both sides of the continuous sheet of material 210. Although the integrated processing tool 200 is configured to process a vertically oriented continuous sheet of material 210, the integrated processing tool 200 may be configured to process substrates positioned in different orientations, for example, a horizontally oriented continuous sheet of material 210. In certain implementations, the continuous sheet of material 210 is a flexible conductive substrate.

In certain implementations, the integrated processing tool 200 comprises a transfer mechanism 205. The transfer mechanism 205 may comprise any transfer mechanism capable of moving the continuous sheet of material 210 through the processing region of the processing chambers 220 and 230. The transfer mechanism 205 may comprise a common transport architecture. The common transport architecture may comprise a reel-to-reel system with a common take-up-reel 214 and a feed reel 212 for the system. The take-up reel 214 and the feed reel 212 may be individually heated. The take-up reel 214 and the feed reel 212 may be individually heated using an internal heat source positioned within each reel or an external heat source. The common transport architecture may further comprise one or more intermediate transfer reels (213a & 213b, 216a & 216b, 218a & 218b) positioned between the take-up reel 214 and the feed reel 212. Although the integrated processing tool 200 is depicted as having a single processing region, in certain implementations, it may be advantageous to have separate or discrete processing regions, modules, or chambers for each process step. For implementations having discrete processing regions, modules, or chambers, the common transport architecture may be a reel-to-reel system where each chamber or processing region has an individual take-up-reel and feed reel and one or more optional intermediate transfer reels positioned between the take-up reel and the feed reel. The common transport architecture may comprise a track system. The track system extends through the processing regions or discrete processing regions. The track system is configured to transport either a web substrate or discrete substrates.

The integrated processing tool 200 may comprise the feed reel 212 and the take-up reel 214 for moving the continuous sheet of material 210 through the different processing chambers; a first processing chamber 220 for deposition of a lithium metal film and a second processing chamber 230 for forming a protective coating over the lithium metal film for protecting the lithium metal film from ambient oxidants. In some implementations, the finished negative electrode will not be collected on take-up reel 214 as shown in the figures, but may go directly for integration with the separator and positive electrodes, etc., to form battery cells.

The first processing chamber 220 is configured for depositing a thin film of lithium metal on the continuous sheet of material 210. Any suitable lithium deposition process for depositing thin films of lithium metal may be used to deposit the thin film of lithium metal. Deposition of the thin film of lithium metal may be by PVD processes, such as evaporation, a slot-die process, a transfer process, a lamination process or a three-dimensional lithium printing process. The chamber for depositing the thin film of lithium metal may include a PVD system, such as an electron-beam evaporator, a thin film transfer system (including large area pattern printing systems such as gravure printing systems), a lamination system, or a slot-die deposition system.

In one implementation, the first processing chamber 220 is an evaporation chamber. The evaporation chamber has a processing region 242 that is shown to comprise an evaporation source 244a, 244b (collectively 244) that may be placed in a crucible, which may be a thermal evaporator or an electron beam evaporator (cold) in a vacuum environment, for example.

The second processing chamber 230 is configured for forming a protective film on the lithium metal film. The protective film may be an ion conducting material as described herein. The protective film can be formed by dip-coating, slot-die coating, gravure coating, laminating, or printing.

In one implementation, the second processing chamber 230 is a three-dimensional printing chamber. The printing chamber has a processing region 252 that is shown to comprise a printing source 254a, 254b (collectively 254) for printing a polymer ink.

In one implementation, the processing region 242 and the processing region 252 remain under vacuum and/or at a pressure below atmosphere during processing. The vacuum level of processing region 242 may be adjusted to match the vacuum level of the processing region 252. In one implementation, the processing region 242 and the processing region 252 remain at atmospheric pressure during processing. In one implementation, the processing region 242 and the processing region 252 remain under an inert gas atmosphere during processing. In one implementation, the inert gas atmosphere is an argon gas atmosphere. In one implementation, the inert gas atmosphere is a nitrogen gas ($N_2$) atmosphere.

Figure 3:
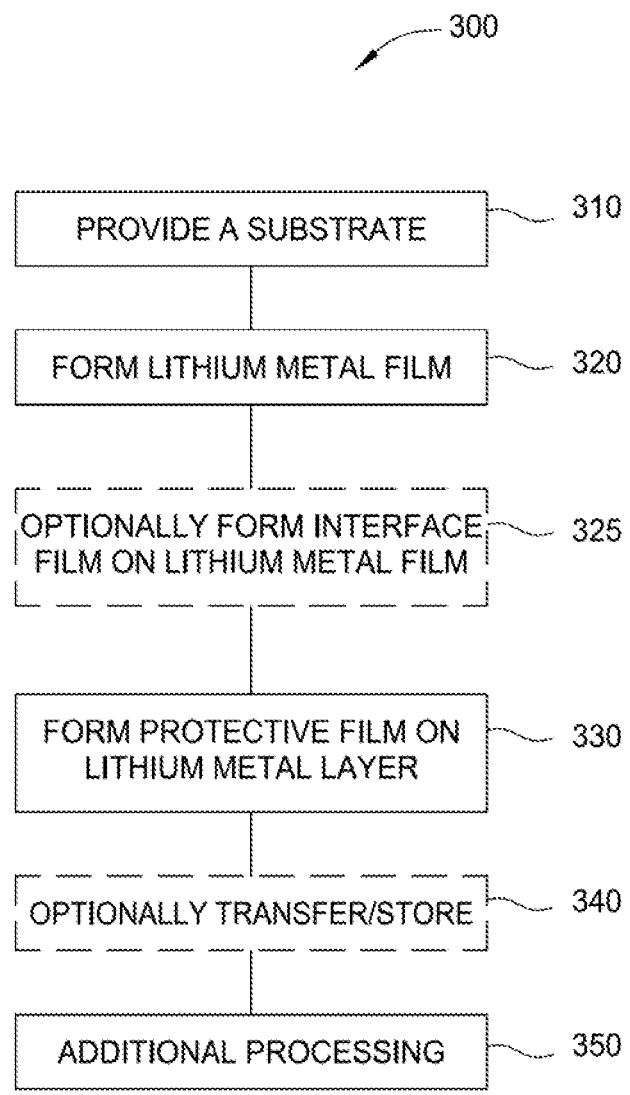
FIG. 3 illustrates a process flow chart summarizing one implementation of a method for forming an electrode structure according to implementations described herein.

FIG. 3 illustrates a process flow chart summarizing one implementation of a method 300 for forming an electrode structure according to implementations described herein. At operation 310, a substrate is provided. The substrate may be continuous sheet of material 210. The substrate may have a negative electrode material formed thereon. The negative electrode material may be negative electrode 140. At operation 320, a lithium metal film is formed. The lithium metal film may be lithium metal film 145. If a negative electrode material is present, the lithium metal film is formed on the negative electrode. If the negative electrode 140 is not present, the lithium metal film may be formed directly on the substrate. The lithium metal film may be formed in the first processing chamber 220. Optionally, at operation 325, the interface film 147 is formed on the lithium metal film 145. At operation 330, a protective film is formed on either the lithium metal film 145 or the interface film 147. The protective film may be protective film 170. The protective film may be an ion conducting polymer. The protective film may be formed in the second processing chamber 230. At operation 340, the substrate with the lithium metal film and the protective film may optionally be stored, transferred to another tool, or both. At operation 350, the substrate with the lithium metal film and the protective film formed thereon is subject to additional processing.

FIG. 4 illustrates a schematic view of another integrated processing tool 400 according to implementations described herein. The integrated processing tool 400 is similar to the integrated processing tool 200 except that integrated processing tool 400 is configured to deposit an interleaf film 430 on the lithium metal film. In certain implementations, the integrated processing tool 400 comprises a first processing chamber 420 configured to perform processing operations to a continuous sheet of material 210. The first processing chamber 420 is configured to deposit a thin film of lithium metal on the continuous sheet of material 210. The first processing chamber 420 is further configured to deposit an interleaf film 430a, 430b (collectively 430) on the lithium metal film for protecting the lithium metal film from ambient oxidants. Although the first processing chamber 420 contains both the lithium metal film deposition apparatus and the interleaf film, it should be understood that lithium metal film and the interleaf film could be deposited in separate stand-alone modular processing chambers.

In certain implementations, the first processing chamber 420 is configured to process both sides of the continuous sheet of material 210. Although the integrated processing tool 400 is configured to process a vertically oriented continuous sheet of material 210, the integrated processing tool 400 may be configured to process substrates positioned in different orientations, for example, a horizontally oriented continuous sheet of material 210. In certain implementations, the continuous sheet of material 210 is a flexible conductive substrate.

In certain implementations, the integrated processing tool 400 comprises the transfer mechanism 205. The transfer mechanism 205 may comprise any transfer mechanism capable of moving the continuous sheet of material 210 through the processing region of the first processing chamber 420. The transfer mechanism 205 may comprise a common transport architecture. The common transport architecture may comprise a reel-to-reel system with a common take-up-reel 214 and a feed reel 212 for the system. The take-up reel 214 and the feed reel 212 may be individually heated. The take-up reel 214 and the feed reel 212 may be individually heated using an internal heat source positioned within each reel or an external heat source. The transfer mechanism 205 may further comprise one or more intermediate transfer reels (413a & 413b, 416a & 416b, 418a & 418b) positioned between the take-up reel 214 and the feed reel 212. In some implementations, intermediate transfer reels 418a, 418b compress the interleaf film onto the lithium metal film. In some implementations, the intermediate transfer reels 418a, 418b laminate the interleaf film onto the lithium metal film. In some implementations, the intermediate transfer reels 418a, 418b are heated.

Although the integrated processing tool 400 is depicted as having a single processing region, in certain implementations, it may be advantageous to have separated or discrete processing regions, modules, or chambers for each process operation. For implementations having discrete processing regions, modules, or chambers, the common transport architecture may be a reel-to-reel system where each chamber or processing region has an individual take-up-reel and feed reel and one or more optional intermediate transfer reels positioned between the take-up reel and the feed reel. The common transport architecture may comprise a track system. The track system extends through the processing regions or discrete processing regions. The track system is configured to transport either a web substrate or discrete substrates.

The first processing chamber 420 is configured for depositing a thin film of lithium metal on the continuous sheet of material 210. Any suitable lithium deposition process for depositing thin films of lithium metal may be used to deposit the thin film of lithium metal. Deposition of the thin film of lithium metal may be by PVD processes, such as evaporation, a slot-die process, a transfer process, or a three-dimensional lithium printing process. The chamber for depositing the thin film of lithium metal may include a PVD system, such as an electron-beam evaporator, a thin film transfer system (including large area pattern printing systems such as gravure printing systems) or a slot-die deposition system.

In one implementation, the first processing chamber 420 is an evaporation chamber. The evaporation chamber has a processing region 442 that is shown to comprise an evaporation source 444a, 444b (collectively 444) that may be placed in a crucible, which may be a thermal evaporator or an electron beam evaporator (cold) in a vacuum environment, for example.

The first processing chamber 420 is further configured to deposit the interleaf film 430 on the lithium metal film.

In one implementation, the processing region 442 remains under vacuum and/or at a pressure below atmosphere during processing. In one implementation, the processing region 442 remains under an inert gas atmosphere during processing. In one implementation, the inert gas atmosphere is an argon gas atmosphere. In one implementation, the inert gas atmosphere is a nitrogen gas ($N_2$) atmosphere.

FIG. 4B illustrates a schematic view of another integrated processing tool 450 according to implementations described herein. In certain implementations, the integrated processing tool 450 comprises a plurality of processing modules or processing chambers 460 and 470 arranged in a line, each configured to perform one processing operation to a continuous sheet of material 210. In one implementation, the processing chambers 460 and 470 are stand-alone modular processing chambers wherein each modular processing chamber is structurally separated from the other modular processing chambers. Therefore, each of the stand-alone modular processing chambers, can be arranged, rearranged, replaced, or maintained independently without affecting each other. In certain implementations, the processing chambers 460 and 470 are configured to process both sides of the continuous sheet of material 210. Although the integrated processing tool 450 is configured to process a vertically oriented continuous sheet of material 210, the integrated processing tool 450 may be configured to process substrates positioned in different orientations, for example, a horizontally oriented continuous sheet of material 210. In certain implementations, the continuous sheet of material 210 is a flexible conductive substrate.

In certain implementations, the integrated processing tool 450 comprises a transfer mechanism 205. The transfer mechanism 205 may comprise any transfer mechanism capable of moving the continuous sheet of material 210 through the processing region of the processing chambers 460 and 470. The transfer mechanism 205 may comprise a common transport architecture. The common transport architecture may comprise a reel-to-reel system with a common take-up-reel 214 and a feed reel 212 for the system. The take-up reel 214 and the feed reel 212 may be individually heated. The take-up reel 214 and the feed reel 212 may be individually heated using an internal heat source positioned within each reel or an external heat source. The common transport architecture may further comprise one or more intermediate transfer reels (473a & 473b, 476a & 476b, 478a & 478b) positioned between the take-up reel 214 and the feed reel 212.

Although the integrated processing tool 200 is depicted as having two separate processing regions, in certain implementations, it may be advantageous to have a common processing region. For implementations having discrete processing regions, modules or chambers, the common transport architecture may be a reel-to-reel system where each chamber or processing region has an individual take-up-reel and feed reel and one or more optional intermediate transfer reels positioned between the take-up reel and the feed reel. The common transport architecture may comprise a track system. The track system extends through the processing regions or discrete processing regions. The track system is configured to transport either a web substrate or discrete substrates.

The integrated processing tool 200 may comprise feed reel 212 and take-up reel 214 for moving the continuous sheet of material 210 through the different processing chambers; a first processing chamber 460 for removing the interleaf film from the negative electrode a second processing chamber 470 for additional processing of the negative electrode. In one implementation, the intermediate transfer reels 473a & 473b are configured to remove the interleaf film from the continuous sheet of material 210. In some implementations, the finished negative electrode will not be collected on take-up reel 214 as shown in the figures, but may go directly for integration with the separator and positive electrodes, etc., to form battery cells.

The first processing chamber 460 is configured to remove the interleaf film 430 from the continuous sheet of material 210. The first processing chamber includes a processing region 462 and at least one set of intermediate transfer reels 473a, 473b for removing the interleaf film prior to additional processing.

The second processing chamber 470 is configured for additional processing of the continuous sheet of material 210. The second processing chamber includes a processing region 472.

In one implementation, the processing region 462 and the processing region 472 remain under vacuum and/or at a pressure below atmosphere during processing. The vacuum level of processing region 462 may be adjusted to match the vacuum level of the processing region 472. In one implementation, the processing region 462 and the processing region 472 remain at atmospheric pressure during processing. In one implementation, the processing region 462 and the processing region 472 remain under an inert gas atmosphere during processing. In one implementation, the inert gas atmosphere is an argon gas atmosphere. In one implementation, the inert gas atmosphere is a nitrogen gas ($N_2$) atmosphere. In one implementation, at least one of the processing region 462 and the processing region 472 remain under vacuum and/or at a pressure below atmosphere during processing while the other processing region remains either at atmospheric pressure or under an inert gas atmosphere.

Figure 5:
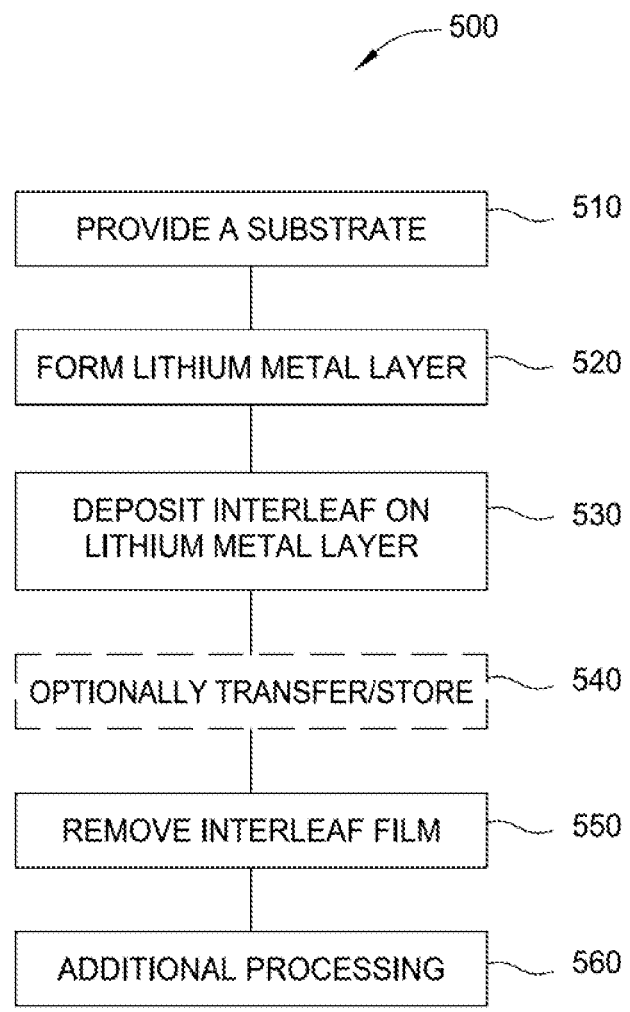
FIG. 5 illustrates a process flow chart summarizing one implementation of a method for forming an electrode structure according to implementations described herein.

FIG. 5 illustrates a process flow chart summarizing one implementation of a method 500 for forming an electrode structure according to implementations described herein. At operation 510, a substrate is provided. The substrate may be the continuous sheet of material 210. The substrate may have a negative electrode material formed thereon. The negative electrode material may be negative electrode 140. At operation 520, a lithium metal film is formed. If a negative electrode material is present, the lithium metal film is formed on the negative electrode material. If the negative electrode material is not present, the lithium metal film may be formed directly on the substrate. The lithium metal film may be formed in the first processing chamber 420. The lithium metal film may be lithium metal film 145. If a negative electrode material is present, the lithium metal film is formed on the negative electrode. At operation 530, an interleaf film is formed on the lithium metal film. The interleaf film may be formed on the lithium metal film in the first processing chamber 420. In some implementations, the interleaf film may be formed on the lithium metal film in a separate processing chamber. At operation 540, the substrate with the lithium metal film and the interleaf film may optionally be stored, transferred to another tool, or both. At operation 550, the interleaf film is removed. At operation 560, the substrate with the lithium metal film is subject to additional processing.

Figure 6:
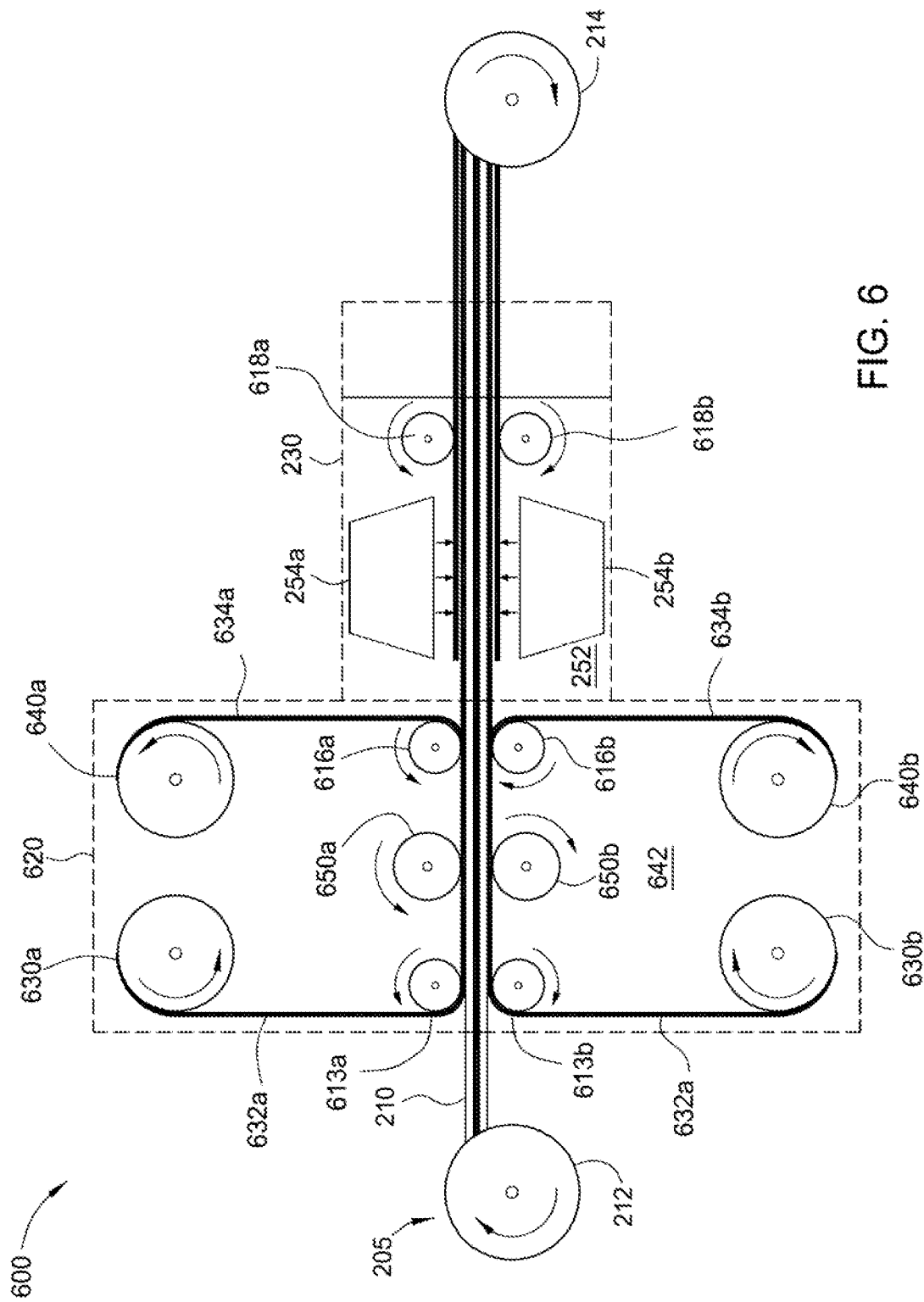
FIG. 6 illustrates a schematic view of another integrated processing tool according to implementations described herein.

FIG. 6 illustrates a schematic view of another integrated processing tool 600 according to implementations described herein. The integrated processing tool 600 may be used to form, for example, the lithium-ion energy storage device 100 or the negative electrode cell 160. The integrated processing tool 600 is similar to the integrated processing tool 200 except that integrated processing tool 600 is configured to deposit the lithium metal film via a lamination process. The first processing chamber 220 of integrated processing tool 200 is replaced by a lamination-processing chamber 620. The lamination-processing chamber 620 is configured to deposit a thin film of lithium metal formed on an interleaf film. In one implementation, an interface film (e.g., release film) is formed between the lithium metal film and the interleaf film as described herein. In addition, after lamination of the lithium metal film onto the continuous sheet of material 210, the lamination-processing chamber 620 is configured to remove the interleaf film from the laminated metal film. If the release film is present, the release film typically aids in removal of the interleaf film from the lithium metal film and may be removed with the interleaf film. If the negative electrode is patterned, a continuous lamination layer is moving in a segmented semicontinuous fashion to accommodate lamination of patterned electrode.

In certain implementations, the lamination-processing chamber 620 is configured to process both sides of the continuous sheet of material 210. Although the integrated processing tool 600 is configured to process a vertically oriented continuous sheet of material 210, the integrated processing tool 600 may be configured to process substrates positioned in different orientations, for example, a horizontally oriented continuous sheet of material 210. In certain implementations, the continuous sheet of material 210 is a flexible conductive substrate.

In certain implementations, the integrated processing tool 600 comprises the transfer mechanism 205. The transfer mechanism 205 may comprise any transfer mechanism capable of moving the continuous sheet of material 210 through the processing region of the lamination-processing chamber 620. The transfer mechanism 205 may comprise a common transport architecture. The common transport architecture may comprise a reel-to-reel system with a common take-up-reel 214 and a feed reel 212 for the system. The take-up reel 214 and the feed reel 212 may be individually heated. The take-up reel 214 and the feed reel 212 may be individually heated using an internal heat source positioned within each reel or an external heat source. The transfer mechanism 205 may further comprise one or more intermediate transfer reels (613a & 613b, 616a & 616b, 618a & 618b) positioned between the take-up reel 214 and the feed reel 212.

Although the integrated processing tool 600 is depicted as having separate processing regions, in certain implementations, it may be advantageous to have a common processing region. For implementations having discrete processing regions, modules, or chambers, the common transport architecture may be a reel-to-reel system where each chamber or processing region has an individual take-up-reel and feed reel and one or more optional intermediate transfer reels positioned between the take-up reel and the feed reel. The common transport architecture may comprise a track system. The track system extends through the processing regions or discrete processing regions. The track system is configured to transport either a web substrate or discrete substrates.

The lamination-processing chamber 620 is configured to deposit a thin film of lithium metal on the continuous sheet of material 210 via a lamination process. The lamination-processing chamber 620 includes a lithium metal film/interleaf film supply roll 630a, 630b for supplying a lithium metal film/interleaf film 632a, 632b to the continuous sheet of material 210. The lamination-processing chamber 620 further includes an interleaf take-up reel 640a, 640b for collecting the removed interleaf film 634a, 634b. In some implementations, the lamination-processing chamber 620 further includes an optional compression roller 650a, 650b for applying pressure to the lithium metal film/interleaf film 632a, 632b to laminate the lithium metal film to the continuous sheet of material 210. In some implementations the lithium metal film/interleaf film 632a, 632b further includes a release film formed therebetween as described herein. In some implementations, the compression roller 650a, 650b is heated. In some implementations where the compression roller 650a, 650b is not present, intermediate transfer reels 616a, 616b compress the lithium metal film/interleaf film 632a, 632b onto the continuous sheet of material 210. In some implementations, the intermediate transfer reels 616a, 616b laminate the lithium metal film/interleaf film 632a, 632b onto the continuous sheet of material 210. In some implementations, the intermediate transfer reels 616a, 616b are heated.

In one implementation, the lamination-processing chamber 620 has a processing region 642. In some implementations, the processing region 642 remains under vacuum and/or at a pressure below atmosphere during processing. In one implementation, the processing region 642 remains under an inert gas atmosphere during processing. In one implementation, the inert gas atmosphere is an argon gas atmosphere. In one implementation, the inert gas atmosphere is a nitrogen gas ($N_2$) atmosphere.

In operation, as the continuous sheet of material 210 travels between the feed reel 212 and the take-up reel 214, the lithium metal film/interleaf film supply roll 630a, 630b supplies the lithium metal film/interleaf film 632a, 632b onto the continuous sheet of material 210. The lithium metal film/interleaf film supply roll 630a, 630b supplies the lithium metal film/interleaf film 632a, 632b, and release film if present, so that the lithium metal film contacts the continuous sheet of material 210. Then, the lithium metal film is compressed by compression roller 650a, 650b to laminate the lithium metal film to the continuous sheet of material 210. After lamination, the interleaf film 634a, 634b is removed from the surface of the laminated lithium metal film by transfer reel 616a, 616b. The removed interleaf film 634a, 634b is collected by interleaf take-up reel 640a, 640b.

After lamination of the lithium metal film to the continuous sheet of material 210, the continuous sheet of material travels into the second processing chamber 230 for optional additional processing.

Figure 7:
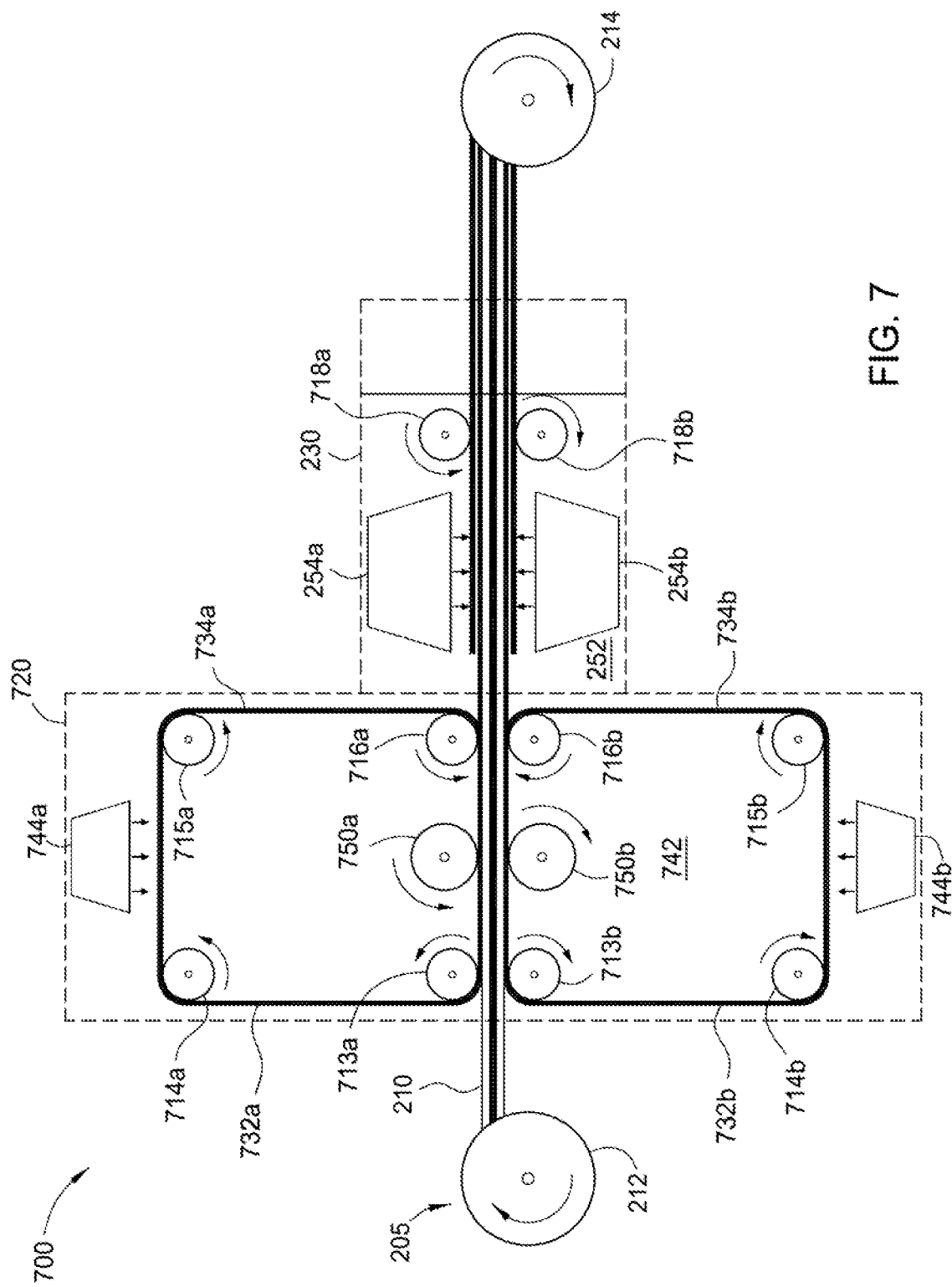
FIG. 7 illustrates a schematic view of yet another integrated processing tool according to implementations described herein.

FIG. 7 illustrates a schematic view of yet another integrated processing tool 700 according to implementations described herein. The integrated processing tool 700 may be used to form, for example, the lithium-ion energy storage device 100 or the negative electrode cell 160. The integrated processing tool 700 is similar to the integrated processing tool 600 except that integrated processing tool 700 is configured to deposits the lithium metal film via a closed-loop lamination process. The lamination-processing chamber 620 of integrated processing tool 600 is replaced by a closed-loop lamination-processing chamber 720. The closed-loop lamination-processing chamber 720 is configured to form a thin film of lithium metal on a continuous loop of an interleaf film 734a, 734b and then the combined lithium metal film/interleaf film 732a, 732b. The continuous loop of the interleaf film may also include a release film formed thereon. In addition, after lamination of the lithium metal film onto the continuous sheet of material 210, the closed-loop lamination-processing chamber 720 is configured to remove the interleaf film 734a, 734b from the laminated metal film.

In certain implementations, the closed-loop lamination-processing chamber 720 is configured to process both sides of the continuous sheet of material 210. Although the integrated processing tool 700 is configured to process a vertically oriented continuous sheet of material 210, the integrated processing tool 700 may be configured to process substrates positioned in different orientations, for example, a horizontally oriented continuous sheet of material 210. In certain implementations, the continuous sheet of material 210 is a flexible conductive substrate.

In certain implementations, the integrated processing tool 700 comprises the transfer mechanism 205. The transfer mechanism 205 may comprise any transfer mechanism capable of moving the continuous sheet of material 210 through the processing region of the closed-loop lamination-processing chamber 720. The transfer mechanism 205 may comprise a common transport architecture. The common transport architecture may comprise a reel-to-reel system with a common take-up-reel 214 and a feed reel 212 for the system. The take-up reel 214 and the feed reel 212 may be individually heated. The take-up reel 214 and the feed reel 212 may be individually heated using an internal heat source positioned within each reel or an external heat source. The transfer mechanism 205 may further comprise one or more intermediate transfer reels (713a & 713b, 714a & 714b, 715a & 715b, 716a & 716b, 718a & 718b) positioned between the take-up reel 214 and the feed reel 212. Transfer reels 713a & 713b, 714a & 714b, 715a & 715b, 716a & 716b form the closed-loop that interleaf film 734a, 734b travels along.

The closed-loop lamination-processing chamber 720 further includes an optional compression roller 750a, 750b for applying pressure to the lithium metal film/interleaf film 732a, 732b to laminate the lithium metal film to the continuous sheet of material 210. In some implementations, the compression roller 750a, 750b is heated. In some implementations where the compression roller 750a, 750b is not present, intermediate transfer reels 716a, 716b compress the lithium metal film/interleaf film 732a, 732b onto the continuous sheet of material 210. In some implementations, the intermediate transfer reels 716a, 716b laminate the lithium metal film/interleaf film 732a, 732b onto the continuous sheet of material 210. In some implementations, the intermediate transfer reels 716a, 716b are heated.

In one implementation, the closed-loop lamination-processing chamber 720 defines a processing region 742. In some implementations, the processing region 742 remains under vacuum and/or at a pressure below atmosphere during processing. In one implementation, the processing region 742 remains under an inert gas atmosphere during processing. In one implementation, the inert gas atmosphere is an argon gas atmosphere. In one implementation, the inert gas atmosphere is a nitrogen gas ($N_2$) atmosphere.

The closed-loop lamination-processing chamber 720 is further configured for depositing a thin film of lithium metal on the continuous sheet of material 210. Any suitable lithium deposition process for depositing thin films of lithium metal may be used to deposit the thin film of lithium metal. Deposition of the thin film of lithium metal may be by PVD processes, such as evaporation, a slot-die process, a transfer process, a lamination process or a three-dimensional lithium printing process. The chamber for depositing the thin film of lithium metal may include a PVD system, such as an electron-beam evaporator, a thin film transfer system (including large area pattern printing systems such as gravure printing systems), a lamination system, or a slot-die deposition system.

In one implementation, closed-loop lamination-processing chamber 720 includes an evaporation source 744a, 744b (collectively 744) that may be placed in a crucible, which may be a thermal evaporator or an electron beam evaporator (cold) in a vacuum environment, for example. The evaporation source 744 deposits the lithium metal film on the interleaf film 734a, 734b to form the lithium metal film/interleaf film 732a, 732b.

In operation, as the interleaf film 734a, 734b travels along the closed-loop formed by the transfer reels 713a & 713b, 714a & 714b, 715a & 715b, 716a & 716b, the lithium metal film is deposited on the interleaf film 734a, 734b to form the lithium metal film/interleaf film 732a, 732b. As the continuous sheet of material 210 travels between the feed reel 212 and the take-up reel 214, the lithium metal film/interleaf film 732a, 732b contacts the continuous sheet of material 210. Then, the lithium metal film is compressed by compression roller 750a, 750b to laminate the lithium metal film to the continuous sheet of material 210. After lamination, the interleaf film 734a, 734b releases from the surface of the laminated lithium metal film and continues traveling along the closed-loop. The interleaf film 734a, 734b continues along the closed-loop where additional lithium metal film is formed on the interleaf film 734a, 734b.

After lamination of the lithium metal film to the continuous sheet of material 210, the continuous sheet of material travels into the second processing chamber 230 for additional processing.

Additional chambers may be included in the integrated processing tool 200, integrated processing tool 400, integrated processing tool 600, or the integrated processing tool 700. In some implementations, additional chambers may provide for deposition of a separator, an electrolyte soluble binder, or in some implementations, additional chambers may provide for formation of a positive electrode. In some implementations, additional chambers provide for cutting of the negative electrode. The interleaf may be removed after cutting of the negative electrode.

Although implementations of the present disclosure have been particularly described with reference to lithium-ion batteries with graphitic negative electrodes, the teaching and principles of the present disclosure may be applicable to other lithium-based batteries such as Li-polymer, Li—S, Li—$FeS_2$, Li metal based batteries, etc. For the Li metal-based batteries such as Li—S and Li—$FeS_2$ a thicker Li metal electrode may be needed and the thickness of Li metal depends on the positive electrode loading. In some implementations the Li metal electrode may be between 3 and 30 microns thick for Li—S and roughly 190-200 microns for Li—$FeS_2$, and may be deposited on one or both sides of a compatible substrate such as a Cu or stainless steel metal foil—the methods and tools described herein may be used to fabricate such Li metal electrodes.

In summary, some of the benefits of the present disclosure include the efficient integration of lithium metal deposition into currently available processing systems. Currently, lithium metal deposition is performed in a dry room or an argon gas atmosphere. Due to the volatility of lithium metal, subsequent processing steps must also be performed in an argon gas atmosphere. Performance of subsequent processing steps in an argon gas atmosphere would require retrofitting of current manufacturing tools. It has been found by the inventors that coating the lithium metal with a protective film prior to subsequent processing, allows subsequent processing to be performed either under vacuum or at atmosphere. The protective film eliminates the need to perform additional processing operations in an inert gas atmosphere reducing the complexity of tools. The protective film also allows for the transportation, storage, or both of the negative electrode with the lithium metal film formed thereon. In addition, in implementations where the protective film is an ion-conducting film, the ion-conducting film can be incorporated into the final battery structure reducing the complexity of the battery formation process. This reduces the complexity of the tool and subsequently reduces the cost of ownership.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. An integrated processing tool for forming lithium coated negative electrodes, comprising:
a reel-to-reel system for transporting a continuous sheet of material through following processing chambers:
a chamber for depositing a thin film of lithium metal on the continuous sheet of material; and
a chamber for depositing a protective film on a surface of the thin film of lithium metal,
wherein the chamber for depositing the thin film of lithium metal is selected from the group consisting of: a physical vapor deposition (PVD) system, a thin film transfer system, a lamination system, and a slot-die deposition system, and
wherein the chamber for depositing the protective film on the thin film of lithium metal is selected from the group consisting of: a chamber for depositing an interleaf film and a chamber for depositing a lithium-ion conducting polymer on the thin film of lithium metal.

2. An integrated processing tool for forming lithium coated negative electrodes, comprising:
a first chamber for depositing a thin film of lithium metal on a continuous sheet of material, the continuous sheet of material comprising a flexible conductive substrate, the first chamber is selected from the group consisting of: a physical vapor deposition (PVD) system, a thin film transfer system, a lamination system, and a slot-die deposition system;
a second chamber for depositing a protective film on a surface of the thin film of lithium metal, the second chamber is selected from the group consisting of: a chamber for depositing an interleaf film and a chamber for depositing a lithium-ion conducting polymer on the surface of the thin film of lithium metal; and
a reel-to-reel system for transporting the continuous sheet of material through the first chamber and the second chamber.

3. The integrated processing tool of claim 2, wherein the integrated processing tool is configured to process a vertically oriented continuous sheet of material.

4. The integrated processing tool of claim 2, wherein the first chamber is configured to process both sides of the continuous sheet of material.

5. The integrated processing tool of claim 2, wherein the first chamber is the PVD system.

6. The integrated processing tool of claim 5, wherein the PVD system comprises a thermal evaporator.

7. The integrated processing tool of claim 5, wherein the PVD system comprises an electron beam evaporator.

8. The integrated processing tool of claim 2, wherein the first chamber is the thin film transfer system.

9. The integrated processing tool of claim 2, wherein the first chamber is the lamination system.

10. The integrated processing tool of claim 2, wherein the first chamber is the slot-die deposition system.

11. The integrated processing tool of claim 2, wherein the second chamber is the chamber for depositing the interleaf film.

12. The integrated processing tool of claim 2, wherein the second chamber is the chamber for depositing the lithium-ion conducting polymer.

13. The integrated processing tool of claim 2, wherein:
the first chamber is the PVD system; and
the second chamber is the chamber for depositing the interleaf film.

14. An integrated processing tool for forming lithium coated negative electrodes, comprising:
a first chamber for depositing a thin film of lithium metal on a continuous sheet of material, the first chamber selected from the group consisting of: a physical vapor deposition (PVD) system, a thin film transfer system, a lamination system, and a slot-die deposition system;
a second chamber for depositing a protective film on a surface of the thin film of lithium metal, the second chamber is selected from the group consisting of: a chamber for depositing an interleaf film and a chamber for depositing a lithium-ion conducting polymer on the surface of the thin film of lithium metal; and
a reel-to-reel system for transporting the continuous sheet of material through the first chamber and the second chamber, the reel-to-reel system comprising:
a take-up reel; and
a feed reel.

15. The integrated processing tool of claim 14, wherein the continuous sheet of material is a flexible conductive substrate.

16. The integrated processing tool of claim 14, wherein the first chamber is configured to process both sides of the continuous sheet of material.

17. The integrated processing tool of claim 14, wherein the first chamber is the PVD system.

18. The integrated processing tool of claim 2, wherein:
the first chamber is the PVD system; and
the second chamber is the chamber for depositing the lithium-ion conducting polymer.

19. The integrated processing tool of claim 14, wherein the PVD system comprises a thermal evaporator or an electron beam evaporator.

20. The integrated processing tool of claim 14, wherein the integrated processing tool is configured to process a vertically oriented continuous sheet of material.

* * * * *